(12) United States Patent
Swanson

(10) Patent No.: US 6,791,756 B2
(45) Date of Patent: Sep. 14, 2004

(54) SYSTEM AND METHOD FOR EFFICIENT ILLUMINATION IN COLOR PROJECTION DISPLAYS

(75) Inventor: Gary J. Swanson, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/895,865

(22) Filed: Jun. 29, 2001

(65) Prior Publication Data

US 2002/0093740 A1 Jul. 18, 2002

Related U.S. Application Data

(63) Continuation of application No. 08/443,180, filed on May 17, 1995, now Pat. No. 6,417,967, which is a continuation-in-part of application No. 08/330,339, filed on Oct. 27, 1994, now abandoned.

(51) Int. Cl.[7] .............................................. G02B 27/42
(52) U.S. Cl. ...................... 359/567; 359/369; 359/571; 359/900; 345/88
(58) Field of Search .............................. 359/565, 566, 359/567, 569, 571, 615, 900; 348/760, 761, 781, 791; 345/88

(56) References Cited

U.S. PATENT DOCUMENTS

| | | | |
|---|---|---|---|
| 3,860,955 A | 1/1975 | Shinozali | 348/291 |
| 4,079,411 A | 3/1978 | Engelbrecht et al. | 359/575 |
| 4,105,289 A | 8/1978 | Hershel | 359/563 |
| 4,255,019 A | 3/1981 | Knop | 359/569 |
| 4,277,138 A | 7/1981 | Dammann | 359/569 |
| 4,649,351 A | 3/1987 | Veldkamp et al. | 359/349 |
| 4,686,519 A | 8/1987 | Yoshida et al. | 345/88 |
| 4,748,614 A | 5/1988 | Dammann et al. | 359/130 |
| 4,798,448 A | 1/1989 | Van Raalte | 349/62 |
| 4,807,978 A | 2/1989 | Grinberg | 359/20 |
| 4,846,552 A | 7/1989 | Veldkamp et al. | 359/572 |
| 4,882,619 A | 11/1989 | Hasegawa | 348/265 |
| 4,895,790 A | 1/1990 | Swanson et al. | 430/321 |
| 4,933,649 A | 6/1990 | Swanson et al. | 359/349 |
| 5,027,359 A | 6/1991 | Leger et al. | 372/18 |

(List continued on next page.)

FOREIGN PATENT DOCUMENTS

| | | |
|---|---|---|
| DE | 27 42 596 | 4/1995 |
| EP | 0421855 A1 * | 4/1991 |
| EP | 0 583 150 A1 | 2/1994 |

(List continued on next page.)

OTHER PUBLICATIONS

Swanson et al. "Aperture Filling of Phase–Locked Laser Arrays," *Optics Letters*, 12:245–247 (1987).

(List continued on next page.)

*Primary Examiner*—John Juba, Jr.
(74) *Attorney, Agent, or Firm*—Hamilton, Brook, Smith & Reynolds, P.C.

(57) ABSTRACT

A multilevel optical phase element is illuminated with a light source having a plurality of wavelengths of interest. The multilevel phase element disperses light from the light source by diffraction and focuses the dispersed light onto an imaging plane. A light modulating display in the imaging plane having a plurality of pixel elements is actuated. Each pixel element is assigned to transmit a predetermined spectral region within the near field region of the multilevel display element so as to receive the dispersed and focused light from the multilevel optical phase element. A system for displaying a color image includes a light source emitting a plurality of wavelengths of interest, a multilevel optical phase element, and a light modulating electronic display.

34 Claims, 8 Drawing Sheets

U.S. PATENT DOCUMENTS

| | | | |
|---|---|---|---|
| 5,033,060 A | 7/1991 | Leger et al. | 372/97 |
| 5,089,023 A | 2/1992 | Swanson | 623/6 |
| 5,124,843 A | 6/1992 | Leger et al. | 359/565 |
| 5,161,042 A | 11/1992 | Hamada | 349/62 |
| 5,161,059 A | 11/1992 | Swanson et al. | 359/565 |
| 5,218,471 A | 6/1993 | Swanson et al. | 359/565 |
| 5,231,432 A | 7/1993 | Glenn | 353/31 |
| 5,264,880 A | 11/1993 | Sprague et al. | 353/31 |
| 5,272,551 A | 12/1993 | Lehureau et al. | 359/19 |
| 5,344,447 A | 9/1994 | Swanson | 623/6 |
| 5,442,480 A | 8/1995 | Swanson et al. | 359/355 |
| 5,497,269 A | 3/1996 | Gal | 359/615 |
| 5,506,701 A * | 4/1996 | Ichikawa | 359/15 |
| 5,566,007 A * | 10/1996 | Ikeda et al. | 349/5 |
| 5,615,024 A | 3/1997 | May et al. | 359/19 |
| 5,682,265 A | 10/1997 | Farn et al. | 359/571 |

FOREIGN PATENT DOCUMENTS

| | | | |
|---|---|---|---|
| GB | 2 152724 A | 8/1985 | |
| JP | 165624 | 8/1985 | |
| JP | 94826 | 5/1987 | |
| JP | 62150317 | 7/1987 | |
| JP | 62-293222 | 12/1987 | |
| JP | 62293223 | 12/1987 | |
| JP | 118125 | 5/1988 | |
| JP | 64-003603 A * | 1/1989 | |
| JP | 281426 | 11/1989 | |
| JP | 2296213 | 12/1990 | |
| JP | 4-367817 | 12/1992 | |
| JP | 5249318 | 9/1993 | |
| JP | 07-092328 A * | 4/1995 | |
| JP | 165623 | 8/1995 | |
| WO | 95/22773 | 8/1995 | |

OTHER PUBLICATIONS

H. Damman, "Color Separation Gratings," *Applied Optics*, *17*(*15*) :2273–2279 (Aug. 1, 1978).

R.F. Edgar, "The Fresnel Diffraction Images of Peridoic Structures," *Optica Acta, 16*(*3*) :281–287 (Jun. 1969).

Farn et al., "Color Separation Gratings," Conf. On Binary Optics, NASA Conf. Publs 3227, pp. 409–421 (Feb. 1993).

B. Herman et al., "Theory of Dispersive Micro Lenses," Conf. On Binary Optics, NASA Conf. Pubs. 3227, pp. 395–408 (Feb. 1993).

IBM Technical Disclosure Bulletin, *36*(*09B*) :453–456 (Sep. 1993).

Farn et al., "Color Separation by Use of Binary Optics," *Optics Letters, 18*(*15*) :1–3 (Aug. 1, 1993).

* cited by examiner

SYSTEM AND METHOD FOR EFFICIENT ILLUMINATION IN COLOR PROJECTION DISPLAYS

RELATED APPLICATIONS

This application is a continuation application of U.S. application Ser. No. 08/443,180 filed on May 17, 1995 now U.S. Pat. No. 6,417,967, which is a continuation-in-part application of U.S. application Ser. No. 08/330,339, filed Oct. 27, 1994 (abandonded) of the entire teachings of which are incorporated herein by reference.

GOVERNMENT SUPPORT

This invention was made with government support under contract number F19628-85-C-0002 awarded by the Air Force. The government has certain rights in the invention.

FIELD OF THE INVENTION

The invention relates to illumination systems for video displays and more specifically to illumination systems for color projection video displays.

BACKGROUND OF THE INVENTION

Currently used techniques for color projection displays tend to be relatively inefficient in their light utilization. Such low efficiency limits the brightness of the display, which in effect limits the acceptable amount of ambient lighting in a viewing environment.

In certain presently used designs, light from a spectrally broad source is collected by a condensing lens and illuminates a spatial light modulator system. The spatial light modulator system comprises a two-dimensional array of pixels and the amount of light transmitted through each pixel is controlled electronically. A projection lens then images the array of pixels on a viewing screen, the magnification of the displayed image being determined by the particular characteristics of the projection lens. The light impinging on each pixel of the spatial light modulator is spectrally broad (i.e. white light). Therefore, unless the system is modified to distinguish colors, the display will be capable of only displaying black and white images.

In many current systems used to modify such a system so that it is capable of displaying color images each pixel of the spatial light modulator is divided into three sub-pixels having equal areas. Each of the three sub-pixels is covered with a micro-color filter having a different spectral transmittance. For example, the filters are chosen such that one filter transmits only red light, another filter only green light, and the third filter only blue light. The transmittances of the three sub-pixels of each pixel of the spatial light modulator can be controlled independently, resulting in the ability to display a color image.

The inefficiency of the approach can be seen by considering the following factors. The light illuminating a full pixel essentially is white light and, consequently, the light impinging each sub-pixel is also white light. The red filtered sub-pixel will transmit only red light, absorbing all of the incident green and blue light. Likewise, the other two sub-pixels will transmit only its corresponding color, absorbing the other two colors. It is apparent that this approach utilizes, at most, only one third of the available light impinging on the modulator, and absorbs the rest.

Furthermore, state-of-the-art microcolor filters required to produce acceptable color images are only approximately only 33% efficient in transmitting the color that they are designed to transmit. Therefore the overall light utilization of current color projection displays is about 10%.

One approach for improving the efficiency of color projection displays is found in U.S. Pat. No. 5,161,042 issued on Nov. 3, 1994 to H. Hamoda. In accordance therewith, the spectrally broad input light is supplied to three dichroic mirrors which reflect three different color components, e.g., red, green, and blue, in different directions, i.e., at different angles with respect to each other. The reflected components are then supplied to an array of lenses for focusing the different color components so as to converge light beams of similar wavelength ranges for transmission through a liquid crystal display element so as to form combined color images on a display screen. A further U.S. Pat. No. 5,264,880, issued on Nov. 23, 1993, to R. A. Sprague et al., discloses a similar approach to that of Hamoda wherein the dichroic mirrors are replaced by a blaze grating for dispersing the color components of light received thereat into a spectrum of different colors at different angles relative to each other.

It is believed that, while such approaches can be used, the losses of energy of each color component are sufficient to reduce the efficiencies of such systems and to show the need for further improvement in such display systems. Such improved display systems would minimize such losses so as to provide for substantially the total use of the received energy across the color spectrum in the imaging display process resulting in an improvement of the efficiency of the system.

SUMMARY OF THE INVENTION

The invention relates to a color projection display in which received light, having a relatively broad spectrum, illuminates a multi-level optical phase grating so as to disperse each of the color components contained therein into a plurality of different diffraction orders. In one embodiment, the diffraction orders of each color component are then focussed onto a zero-order phase shift element which phase shifts only the undiffracted light (i.e., the zero diffraction order) with respect to the diffracted light (i.e., the higher level diffraction orders). The output of the zero-order phase shifter is then imaged onto a display having a plurality of pixels, each pixel having sub-pixel regions assigned to transmit different color components of light. The depths of the phase grating element and the zero-order phase shifter are suitably selected so that they are practical for manufacture and so that the area of chromaticity space for the color components at the image plane is maximized.

The use of such a combination of multi-level phase grating and a zero-order phase shifter, having suitably determined depths, provides desired color components at each pixel in which essentially little or no energy is lost. These color components are then suitably combined to provide a color image at each of the pixels of the display which is considerably brighter than that available using prior known systems.

In another embodiment a broad spectrum light source illuminates a multilevel optical phase element which disperses the broad spectrum light from the light source by diffraction. A display having a number of pixel elements, each capable of transmitting a predetermined spectral region, is positioned within the near field region of the multilevel optical phase element so as to receive the light dispersed by the multilevel phase element. In one embodiment, the multilevel phase element is periodic in two dimensions, thereby concentrating the light in two dimensions.

In yet another embodiment, a method for displaying a color image is disclosed. The method for displaying a color image includes illuminating a multilevel optical phase element with a broad spectrum light source. The multilevel phase element disperses light from the light source by diffraction. A display having a plurality of pixel elements, each transmitting a predetermined spectral region, is positioned within the near field region of the multilevel optical phase element to receive the dispersed light from the multilevel optical phase element.

BRIEF DESCRIPTION OF THE DRAWINGS

This invention is pointed out with particularity in the appended claims. The above and further advantages of this invention may be better understood by referring to the following description taken in conjunction with the accompanying drawing, in which:

DESCRIPTION OF THE PREFERRED EMBODIMENTS

In order to increase the light utilization of color displays, the novel technique of the invention can be considered, in a conceptual sense, as effectively concentrating all of the light of each color component in a spectrally broad received light on to appropriate sub-pixel regions at a color image plane, e.g., all of the incident red light is concentrated in a manner such that it only illuminates the sub-pixel regions corresponding to the red component thereof, all of the incident green light is concentrated in a manner such that it only illuminates the sub-pixel regions corresponding to the green component thereof, and all of the incident blue light is concentrated in a manner such that it only illuminates the sub-pixel regions corresponding to the blue component thereof. By so doing, the use of micro-filters is not necessary, and the theoretical light utilization efficiency of such technique approaches 100%.

The invention achieves such light utilization based on a technique referred to as aperture filling. Aperture filling is described, for example, in the article, "Aperture filling of phase-locked laser arrays" by G. J. Swanson et al., *Optics Letters,* Vol. 12, April 1987. This article describes a method for increasing the energy in the central lobe of a far-field pattern of a phase-locked laser array. In accordance with the invention, the underlying physics of this technique is modified and extended in a unique manner in order to solve the color display problem of light utilization.

The basic physics behind aperture filling is herein described. A binary amplitude grating (a grating having a transmittance of 1 or 0) with a fill factor (the ratio of the transmitting area to the total area) of greater than or equal to 0.25, has, aside from a phase shift of the zero order, a Fourier transform identical to that of a binary phase grating having the same fill-factor as the binary amplitude grating.

This statement implies that by placing a zero-order phase shift element in the transform plane of an a focal imaging system, the light from an aperture with a fill-factor of $\geq 0.25$, can be uniformly spread out of fill the entire aperture. Further, by invoking reciprocity, light from a uniform aperture can be concentrated to produce an underfilled aperture with a fill-factor of $\geq 0.25$.

Figure 1:
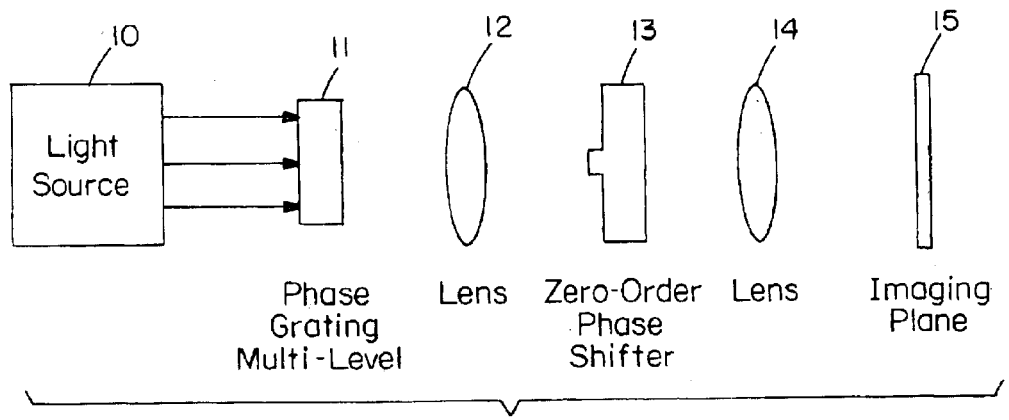
FIGS. 1 and 1A are block diagrams of an embodiment of a display system using the technique of the invention.
Figure 1A:
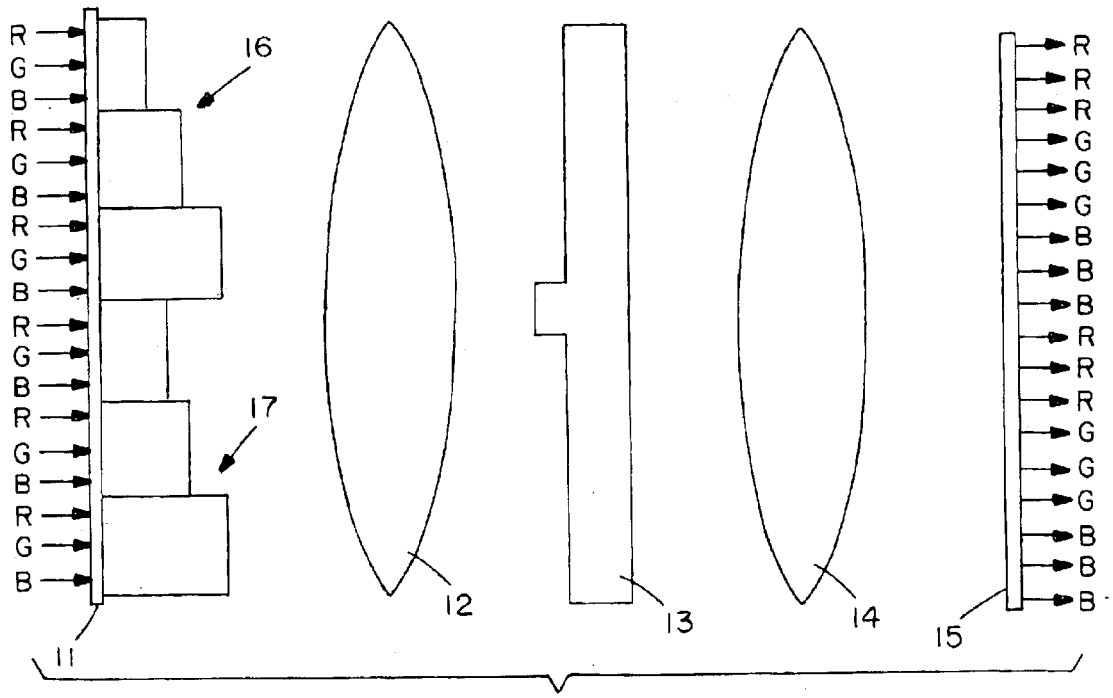
Figure 2:
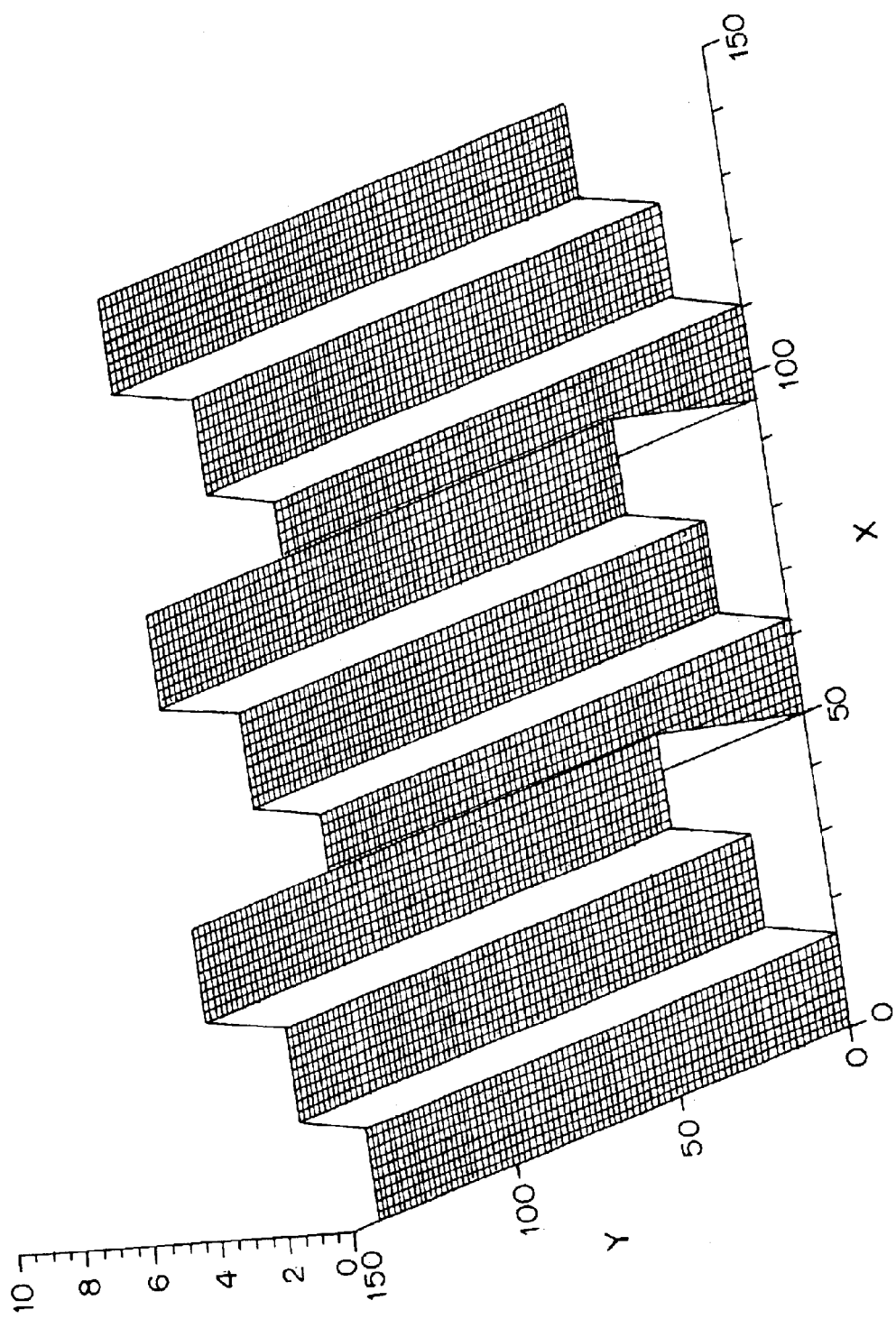
FIG. 2 is a perspective diagram of an embodiment of the multilevel optical phase element.

In making use of such concepts for improving the color projection display efficiency, the above phenomenon can be modified to substantially improve the light throughput thereof. A system embodying the technique in accordance with the invention is shown in FIGS. 1 and 2, wherein a multi-level, e.g., a three-level, phase grating is illuminated with a spectrally broad light from a source 10, such as a tungsten halogen bulb or a xenon arc lamp. Alternatively, the light source may comprise three separate color component sources. For example, three light emitting diodes (LEDs) or three laser sources, each emitting a separate color such as red, green, and blue color components. For the purposes of the particular description of a preferred embodiment of the invention, it is assumed that the illuminating source 10, whether a single broad spectrum source or separate color sources, primarily includes color components of the three wavelength regions, e.g., red, green, and blue. The lateral dimension of each phase level, in one embodiment, is assumed to be equal to the lateral dimension of a sub-pixel region of the spatial light modulator. For illustrative purposes only, FIG. 1A shows only two greatly magnified grating periods, each having corresponding three phase depth levels, occupying the entire aperture. It should be understood that a large plurality of grating periods, each corresponding to a pixel of the overall color image, would normally occupy an aperture.

If it is assumed that a first phase depth level measured with respect to a second phase depth level at each grating period of the phase grating 11 is equal to an integral number of wavelengths of red light plus one-third of such wavelength, i.e., (m+0.33) where m is an integer, and the third phase depth level, again measured with respect to the second phase depth level, is an integer multiple of the wavelength of red light, the red light that is illuminating a three-level phase grating will in effect encounter a binary phase grating with a fill-factor of 33%, and a phase depth of 0.33 wavelengths. The red light will be dispersed from the phase grating 11 into a zero diffraction order and a plurality higher level positive and negative diffraction orders which are focussed on a zero-order phase shifter 13 via lens 12. If the zero diffraction order (undiffracted) is then phase shifted by about 0.33 wavelengths of red light by phase shifter 13, the red light exiting the system will be concentrated via a lens 14 so as to fill only 33% of the output imaging plane 15 (FIG. 1A).

The same methodology as applied above to the red light range can also be applied to the green and blue light ranges.

The second phase depth level at each grating period equals zero wavelengths of green light by definition, and the first and third phase depth levels equal (n−0.33) and n'−0.33) wavelengths of green light, respectively, where n and n' are integers. The green light illuminating the phase grating 11 will also effectively encounter a binary phase grating with a fill-factor of 33%, and a phase depth of 0.33 wavelengths. If the zero diffraction order is also effectively shifted by about 0.33 wavelengths, the green light exiting the system will be concentrated so as to fill the 33% of the output imaging plane that is adjacent to the 33% of the output plane occupied by the red light (FIG. 1A).

For the blue light, the phase depth of level of each grating period, again measured with respect to the second phase depth level, equals (p'+0.33) wavelengths of blue (where p' is an integer), and the first phase depth level is an integer multiple of wavelengths of blue light. The blue light illuminating the grating will also in effect encounter a binary phase grating with a fill-factor of 33%, and a phase depth of 0.33 wavelengths of blue light. If the zero diffraction order is also effectively shifted by about 0.33 wavelengths, the blue light exiting the system will be concentrated so as to fill the remaining 33% of the imaging plane not occupied by the red light and the green light (FIG. 2.).

The above conditions for three discrete wavelengths can in theory be met to any level of accuracy. However, in practice, the accuracy is limited by the physical depths of the grating levels that can be practically manufactured. Furthermore, the system can be designed to operate over the entire visible spectrum, rather than at only three discrete wavelength regions.

The area of chromaticity space spanned by a particular embodiment of the invention depends on the relative depths of the three phase level regions of each grating period corresponding to each pixel, and the depth of the zero-order phase shifter. Since the phase depths are relative, and measured with respect to the second phase depth level, the second phase depth level is zero by definition, thereby leaving three variables: the depths of phase levels 1 and 3 with respect to phase level 2, and the depth of the zero order phase shifter. These three parameters in effect define the performance of the overall system, with the measure of performance being defined as the area of chromaticity space that is so covered. The three depth parameters are most easily optimized by performing a "global search" process that spans the range of practicable manufacturable depths. The goal thereof is to select relative depths which will maximize the area and the location of the spanned chromaticity space. An approach to such process is discussed below.

In considering the first phase level of the grating period, the phase shifts (in waves) $\phi^1_R$, $\phi^1_G$, and $\phi^1_B$ of the red, green, and blue light can be expressed as:

$$\Phi^1_R = \frac{d_1}{\lambda_R}(\eta - 1)$$

$$\Phi^1_G = \frac{d_1}{\lambda_G}(\eta - 1)$$

$$\Phi^1_B = \frac{d_1}{\lambda_B}(\eta - 1)$$

where η is the index of refraction of the phase grating, and $d_1$ is the depth of the first phase level with respect to the second phase level. As mentioned above, it is desired that the phase shift $\phi^1_R$=m+0.33, while the phase shift $\phi^1_G$=n−0.33, and the $\phi^1_B$=p, where m, n, and p are all integers.

In a similar manner at the third phase level, having a depth of $d_3$ with respect to the second phase level, the phase shifts are:

$$\Phi^3_R = \frac{d_3}{\lambda_R}(\eta - 1)$$

$$\Phi^3_G = \frac{d_3}{\lambda_G}(\eta - 1)$$

$$\Phi^3_B = \frac{d_3}{\lambda_B}(\eta - 1)$$

Here, it is desired that the phase shift $\phi^3_R$=m', the phase shift $\phi^3_G$=n'−0.33, and the phase shift $\phi^3_B$=p'+0.33 where m', n', and p' are all integers.

Since the first and third phase levels of the grating are referenced in depth to the second phase level of the grating, by definition, $d_2$=0, and at the second phase level the phase shifts at all three wavelengths is zero:

$$\Phi^2_R = 0$$

$$\Phi^2_G = 0$$

$$\Phi^2_B = 0$$

In addition, at the zero-order phase shifter having a depth of $d_4$, a phase shift of about one-third wavelength of each color is required so that at the phase shifter:

$$\Phi^4_R = \frac{d_4}{\lambda_R}(\eta - 1)$$

$$\Phi^4_G = \frac{d_4}{\lambda_G}(\eta - 1)$$

$$\Phi^4_B = \frac{d_4}{\lambda_B}(\eta - 1)$$

where $\phi^4_R$=r+0.33, $\phi^4_G$=s+0.33 and $\phi^4_B$=t+0.33 (where r, s, and t are integers).

Since the depths of $d_1$, $d_2$, $d_3$, and $d_4$ must be within practical manufacturable limits, the following practical limitations can be imposed thereon:

−5 µm≦$d_1$≦+5 µm
−5 µm≦$d_3$≦+5 µm
−5 µm≦$d_4$≦+5 µm and the value of η can be assumed at a conventional value, for example, of 1.5.

Using the above equations, those in the art can then utilize a well known global search algorithm technique, in which the values of the depths $d_1$, $d_3$, and $d_4$ are changed in steps, Δd, of approximately 0.01 µm, and used to determine in each case the area of the chromaticity space that can be spanned for each set of parameters. The depths $d_1$, $d_3$, and $d_4$ for the solution providing a maximized area can then be used as the practical physical depths for the three phase level regions at each phase grating period and the practical physical depth of the zero-order phase shifter 13.

Figure 3:
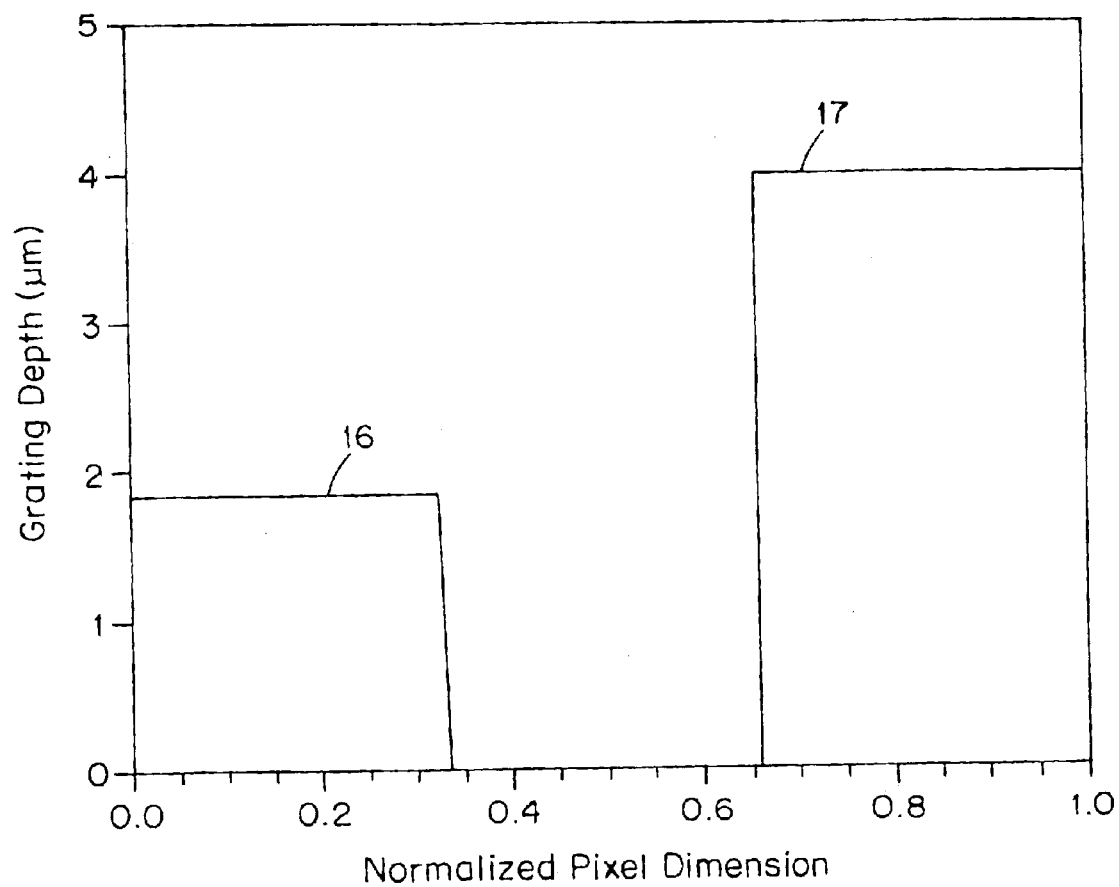
FIG. 3 shows a graph of optimized phase grating depths of three phase levels for a normalized pixel dimension for red, green and blue color channels.

In accordance with a specific embodiment of the invention, such a process was used to determine the three optimum depth parameters for a system operating with a uniform spectral source covering a 0.40–0.68 µm wavelength region, using both multilevel phase grating and zero-order phase shift substrates assumed to have an index of refraction of 1.5. Exemplary results for optimized sub-pixel phase grating depths of an exemplary pixel having a normalized pixel dimension are shown in FIG. 3, with the red channel having a phase grating depth 16 of 1.84 μm relative to the green channel, and the blue channel having a phase grating depth 17 of 4.0 μm relative to the green channel.

Figure 4:
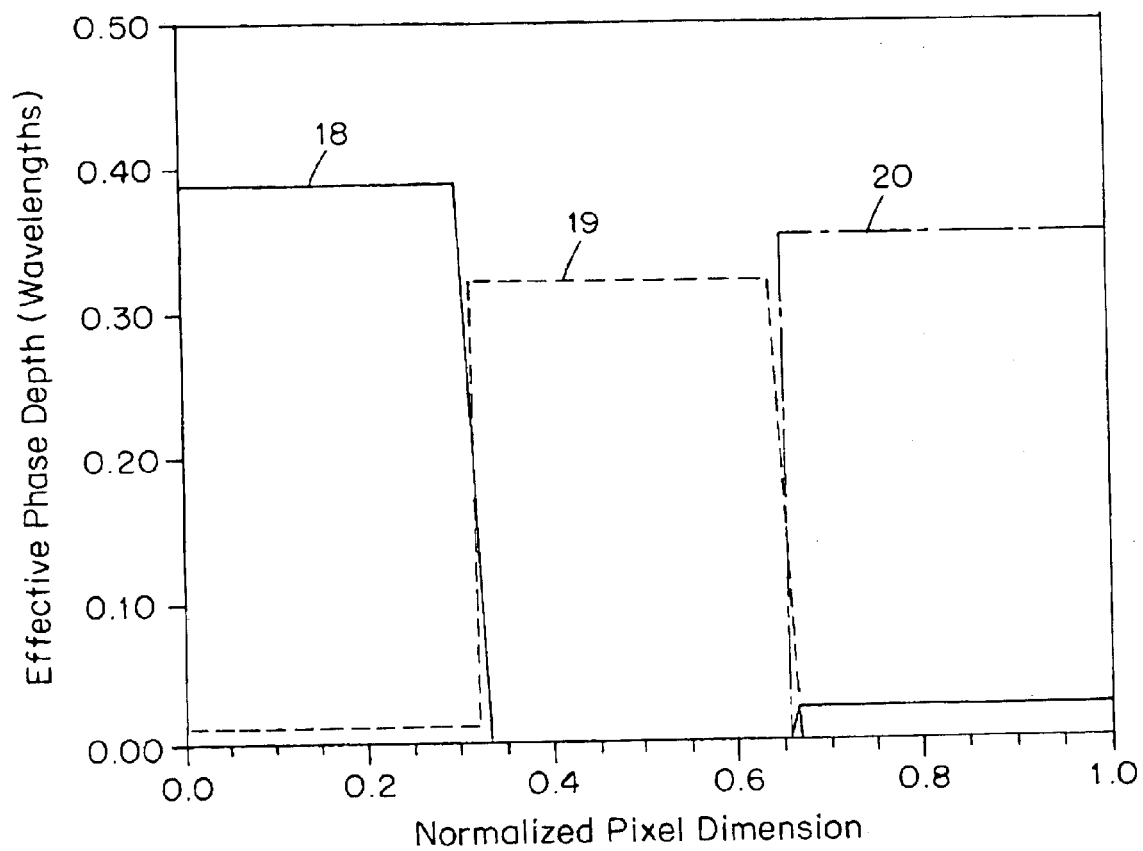
FIG. 4 shows the effective phase grating depths of three phase levels for a normalized pixel dimension for the wavelengths of the red, green and blue color components.

In order to illustrate how such an optimized phase grating design conforms to the theory described above, the following three discrete wavelengths can be considered: red=0.66 μm, green=0.54 μm, and blue=0.46 μm. The effective phase grating depths (modulo one-wave) of the three sub-pixels at these three phase level regions are shown in FIG. 4, where the solid line 18 represents red, the dashed line 19 represents green, and the dot-dash line 20 represents blue. It should be noted that in the first sub-pixel region, the phase grating depth for red is approximates one-third wavelength of red light, and the phase grating depths for green and blue are essentially zero. Similarly, in the second sub-pixel region, the effective phase grating depth for the green approximates one-third wavelength of green light, and the phase grating depths for red and blue are approximately zero. In the third sub-pixel region, the effective phase grating depth for blue approximates one-third wavelength of blue light, while the phase grating depths for red and green are approximately zero.

Figure 2A:
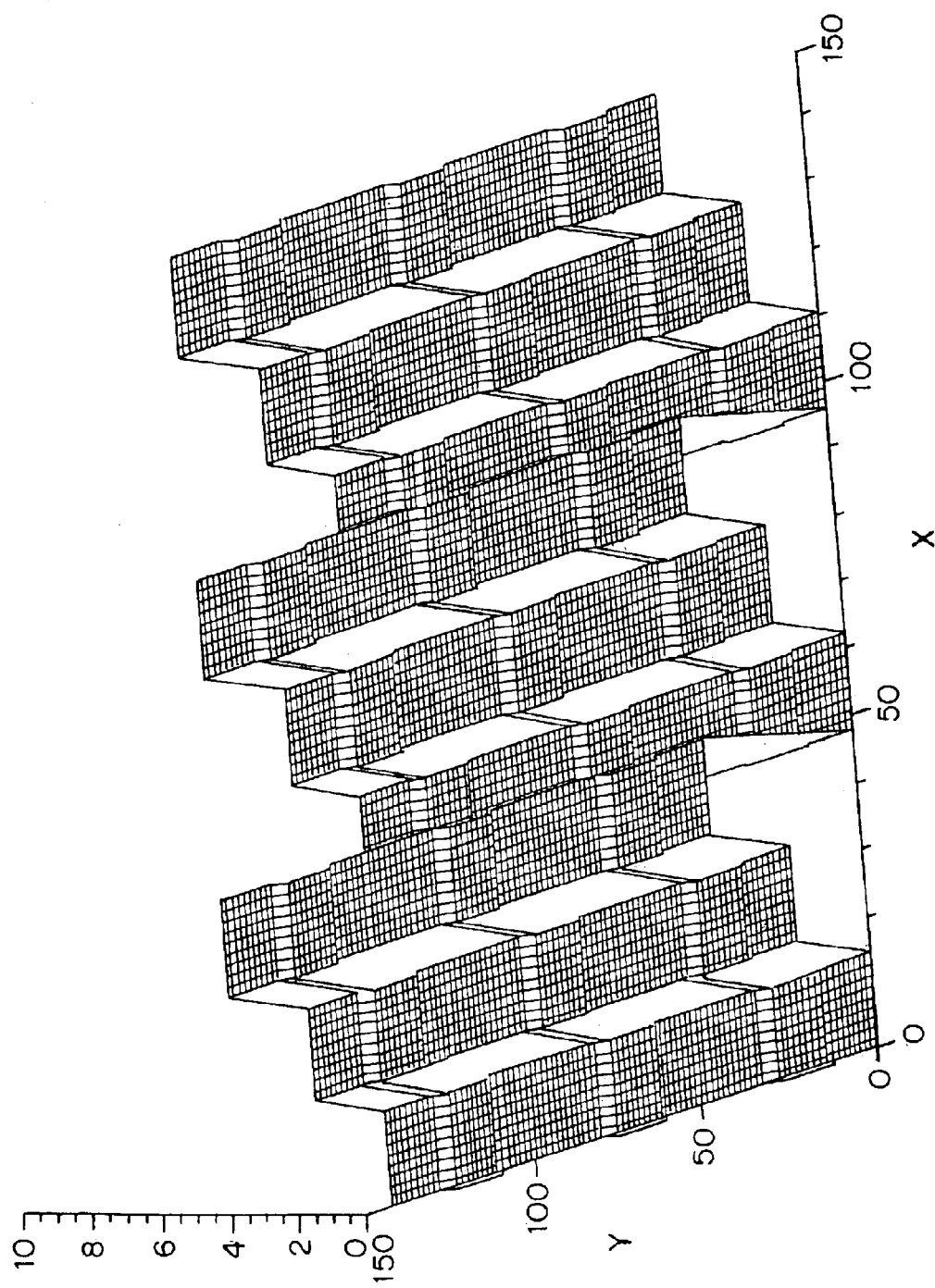
FIG. 2A is a perspective diagram of another embodiment of a multilevel optical phase element of the invention.

The optimized depth for the zero-order phase shifter 13 is 0.36 μm, which depth corresponds to 0.27 wavelengths of red, 0.33 wavelengths of green, and 0.39 wavelengths of blue. For this example, it is noted that the optimum phase depth is less than one wave for all three wavelengths. FIG. 2 is a perspective view of a multilevel phase element which repeats periodically in the x-direction. FIG. 2A is a perspective view of a multilevel phase element which repeats periodically in both the x and y directions. Such a configuration permits the incident light to be compressed both in the x-direction, as in the prior embodiment, and also in the y-direction. Methods for forming such multilevel phase elements are well known to those skilled in the art. In particular a method for forming such multilevel diffractive optical elements is disclosed in U.S. Pat. No. 4,895,790 to Swanson and Veldkamp, assigned to the common assignee of the present invention and incorporated herein by reference.

Figure 5:
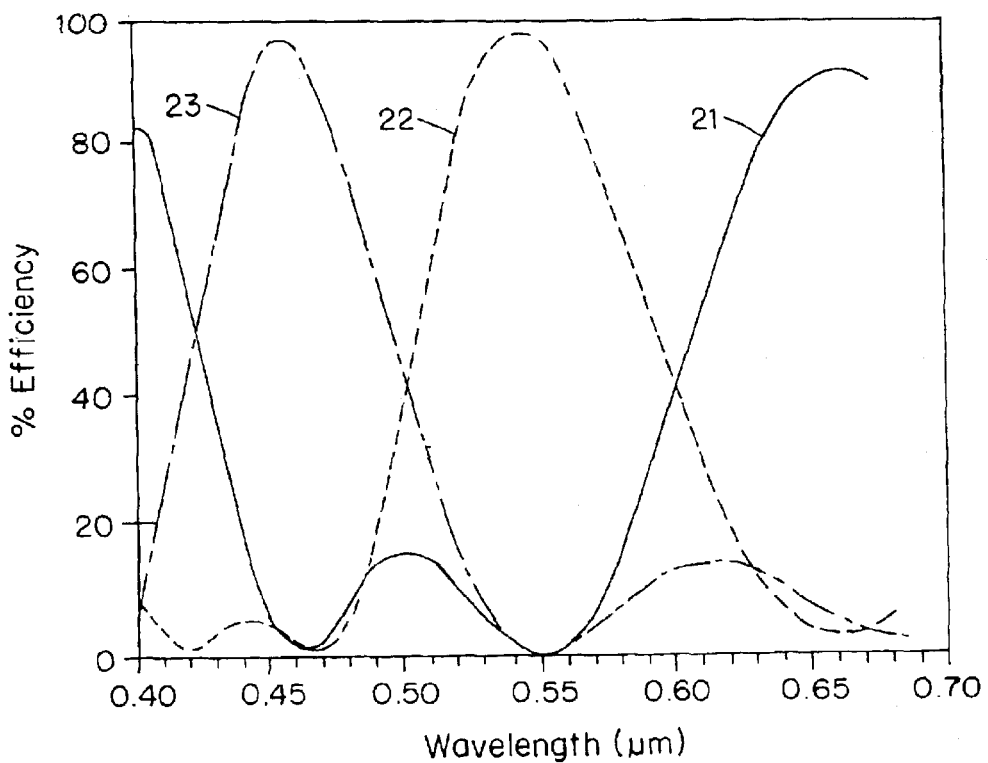
FIG. 5 shows the percent efficiencies of the spectral content for the red, green and blue color components.

The system's ability to concentrate the visible spectrum into three color channels is illustrated in FIG. 5 for the above-mentioned 0.4–0.68 μm wavelength region. The solid curve 21 represents the % efficiency of the spectral content of the red channel, the dashed curve 22 represents the %. efficiency of the spectral content of the green channel, and the dash-dot curve 23 represents the % efficiency of the spectral content of the blue channel. It should be noted that the red channel efficiency peaks at the wavelength of 0.66 μm, the green channel efficiency peaks at 0.54 μm, and the blue channel efficiency peaks at 0.46 μm. The red channel has a secondary peak in the far blue region of the spectrum. This blue light, in effect "leaking" into the red channel, tends to limit the area covered in chromaticity space. In some cases, it may be desired or required to remove this unwanted blue light from the red channel by conventionally filtering the red channel and such removal can be achieved with a blue-blocking micro-filter, albeit at the cost of losing a minimal amount of the blue light energy.

Figure 6:
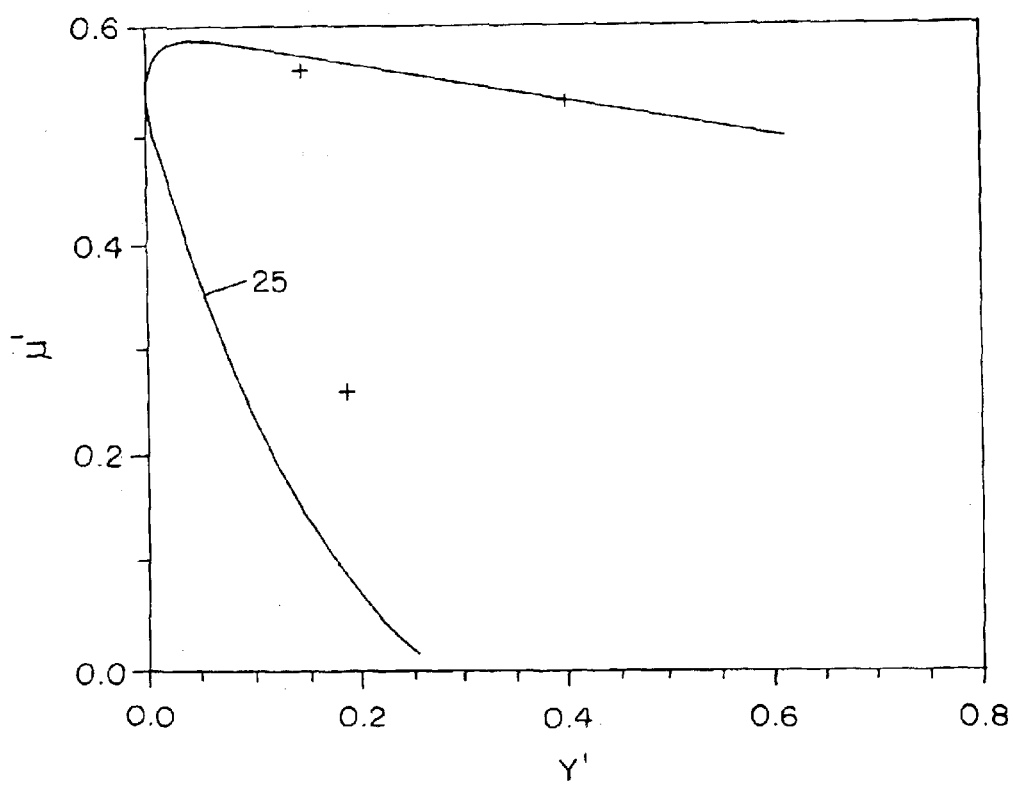
FIG. 6 shows the area of the chromaticity space covered when using a particular embodiment of the invention on a standard 1976 CIE chromaticity graph space.

As is well known to the art, the spectral content of these three color channels can then be used to determine the area of chromaticity space spanned by the system. FIG. 6 shows a standard 1976 CIE chromaticity space graph 25 which is well known to the art. The area of the chromaticity space spanned by the embodiment discussed above is depicted by three vertices of a triangle, defined by the plus signs, in the graph. This area will be covered using essentially 100% of the received source illumination.

Another embodiment of the invention does not require either the zero-order phase plate 13 or the auxiliary optics 12, 14 of the previous embodiment shown in FIG. 1. In this embodiment a broad spectrum light source illuminates a multilevel optical phase element which disperses the broad spectrum light from the light source into diffraction orders. A modulation display, having a number of pixel elements, each capable of transmitting a predetermined spectral region, is positioned within the near field region of the multilevel optical phase element so as to receive the light dispersed by the multilevel phase element. In this embodiment, the free-space propagation of light from the multilevel phase element produces a ⅓ wavelength phase shift of the undiffracted light with respect to the diffracted light. Because of this, the phase plate 13 and auxiliary optical elements 12, 14, which were required to produce the same zero-order phase shift in the previous embodiment, are not required in this embodiment.

To understand how free-space propagation provides the required ⅓ wavelength zero-order phase shift, assume that the amplitude transmittance of the phase grating is expressed as:

$$t(x) = a_0 + \sum_n a_n \exp\left[i2\pi \frac{n}{T} x\right]$$

where T is the grating period, $a_0$ is the amplitude of the undiffracted light, the $a_n$'s are the amplitude coefficients of the various diffracted orders, and n is an indexing parameter.

If a unit amplitude plane wave illuminates this phase grating, the light amplitude distribution, $U_z$, at a distance Z from the grating plane is described by:

$$U_Z(x) = a_o + \sum_n a_n \exp\left[i2\pi \frac{n}{T} x\right] \exp\left[-i\pi\lambda \frac{n^2}{T^2} Z\right].$$

where λ is the wavelength of the unit amplitude plane wave. The irrelevant constants have been omitted from this equation. Thus the free-space propagation over the distance Z has the effect of introducing phase shifts to the diffracted components with respect to the undiffracted component.

A distance, $Z_{1/3}$, is defined by the equation:

$$Z_{1/3} = \frac{2T^2}{3\lambda}$$

where λ is the central wavelength of the spectral distribution.

Substituting this equation for $Z_{1/3}$ into X in the previous equation, results in the following light distribution:

$$U_{Z_{1/3}}(x) = a_o + \sum_n a_n \exp\left[i2\pi \frac{n}{T} x\right] \exp\left[-i\frac{2}{3}\pi n^2\right]$$

The resulting phase shift (for all values of n that do not result in an integer when divided by 3) is equal to an integer number of wavelengths plus ⅓ wavelength. Since the integer number of waves of phase shift are irrelevant, all of the values of n (that do not result in an integer when divided by 3) effectively see a ⅓ wave phase shift with respect to the undiffracted light. For values of n that do result in an integer when divided by 3, the result is an integer number of wavelengths of phase shift. However, for the grating described above, the $a_n$'s (for n divisible by 3) are zero.

Thus, the net result of free-space propagation over the distance $Z_{1/3}$, is to produce a light distribution where the undiffracted light is phase-shifted by ⅓ wavelength with respect to the diffracted light. It is at this location that the modulation display, such as a liquid crystal light modulator, is placed. With such a positioning, no phase shift element 13 or additional optics 12, 14 are needed.

It should be noted that the propagation distance $Z_{1/3}$ is a function of wavelength. Therefore, the free-space propagation just discussed is strictly accurate at only one wavelength. However, acceptable performance over the whole visible spectrum may be achieved by choosing the $Z_{1/3}$ distance to correspond to the wavelength at the center of the spectrum. That is, $Z_{1/3}$ should be chosen such that $$\frac{2T^2}{3\lambda_{long}} < Z_{1/3} < \frac{2T^2}{3\lambda_{short}}$$

where $\lambda_{long}$ is the longest wavelength of interest and $\lambda_{short}$ is the shortest wavelength of interest.

The above analysis assumes that the illumination source is a point source at infinity, resulting in plane wave illumination. If the illumination source is such that the approximation of a point source at infinity which was just discussed is not valid, an embodiment which describes a physically extended illumination source must be considered.

Figure 7:
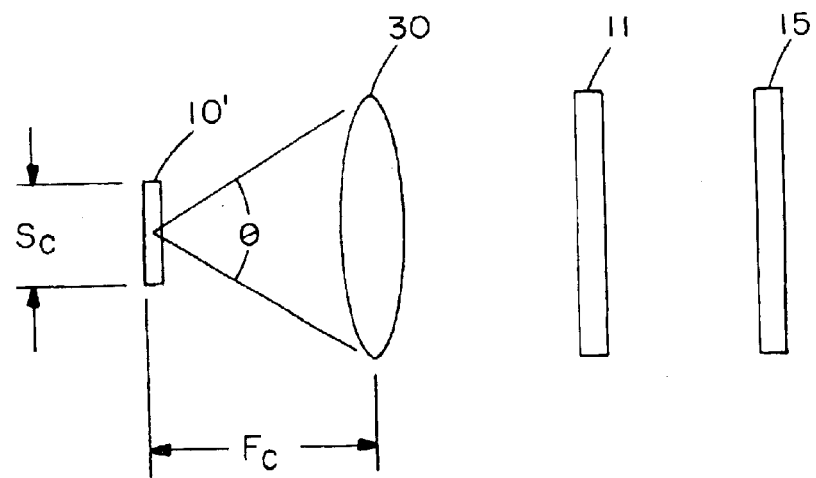
FIG. 7 is a block diagram of another embodiment of a display system of the invention.

In this embodiment, shown in FIG. 7, an illumination source 10' has a dimension (for purposes of discussion referred to as the x-dimension) of $S_c$. A condensing lens 30 having a focal length of $F_c$, is positioned adjacent the illumination source 10', at a distance of $F_c$. This configuration results in an angular source extent in the x-dimension of $\theta_c \approx S_c/F_c$.

A figure of merit for performance is the ratio b/T, where b, the blur, is the physical extent of the light pattern at the display location in the x-dimension and T is the grating period. For good performance, this ratio is less (typically much less) than ⅓. If b is given by the expression $b=Z_{1/3}\theta_c$, the figure of merit becomes:

$$\frac{b}{T} = \frac{2T}{3\lambda_o}\theta_c$$

where $\lambda_o$ is the center wavelength. For example, if an acceptable figure of merit is 1/6, the center wavelength is 0.55 micrometers, and the grating period is 48 micrometers, the resulting value for the angular source size is $\theta_o=2.9$ milliradians. Thus, for a 50 mm focal length condensing lens, a source with a size no larger than 145 micrometers in the x-dimension is required for this figure of merit to hold. Hence, a source 10' with a physical dimension smaller than most commercially available broad-spectrum incoherent sources should be used to obtain good performance. Although broad spectrum incoherent sources of the dimension just described are not generally available, three spatially coherent monochromatic sources, such as 3 different wavelength LED's or laser diodes, could readily be used as the illumination source 10'. As discussed with respect to the previous example, the modulation display should be placed at a distance $Z_{1/3}$ from the multilevel phase element 11.

Figure 8:
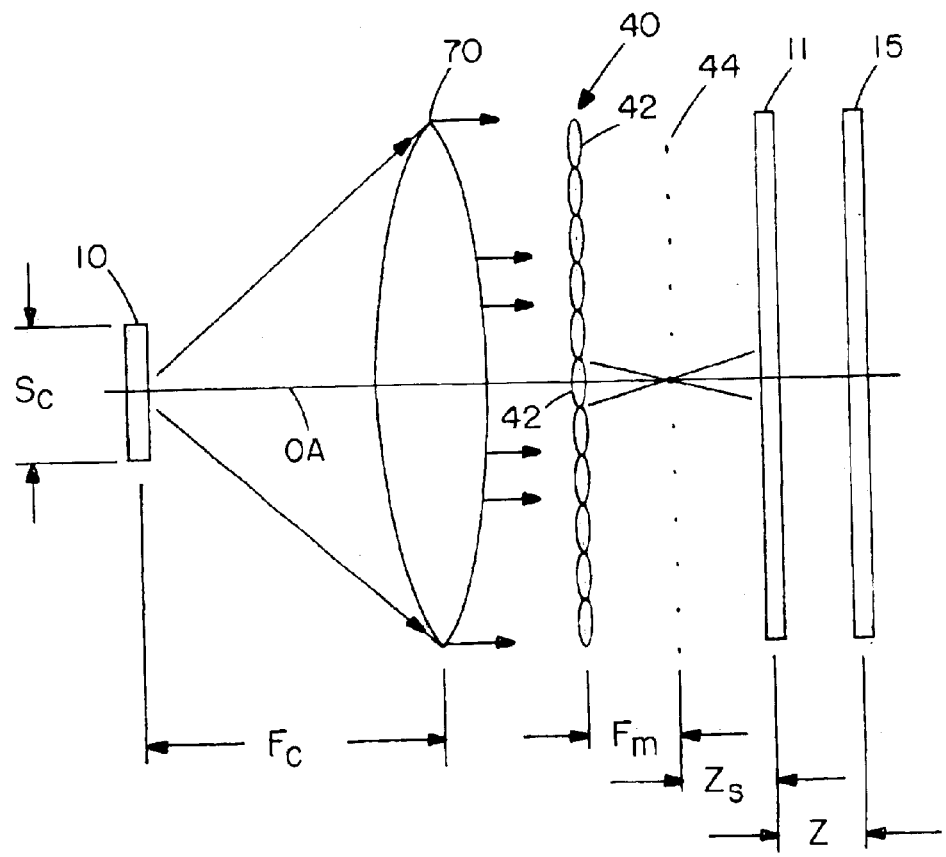
FIG. 8 is a block diagram of yet another embodiment of a display system of the invention.

Refening to FIG. 8, an embodiment which increases the extended source performance includes a lenslet array 40 (in one embodiment cylindrical lenslets), placed between the condensing lens 70 and the multilevel phase element 11. The focal length of each lenslet 42 is $F_m$, and the distance between the lenslet array 40 and the multilevel phase element 11 is $Z_s+F_m$. Thus, $Z_s$ is the distance between the imaged source 44 and the multilevel phase element 11. Each lenslet 42 focuses an image 44 of the extended source, $S_c$, at a distance $F_m$ from the lenslet array 40. Each of these imaged sources 44 will be of physical dimensions, $S_m$, in the x-dimension, where $S_m=(F_m S_c/F_c)$ centered about the optical axis of the respective lenslet 42.

For an image 44 of dimension $S_m$ that lies on the optical axis of the condensing lens, a Fresnel diffraction calculation indicates that the light amplitude distribution at a distance Z from the multilevel phase element 11 is given by the expression:

$$U'_{z(x)} = \exp\left[i\frac{\pi}{\lambda}\frac{x^2}{Z+Z_s}\right]\left[a_o + \sum_n \exp\left[-i\pi\lambda\frac{n^2}{T^2}\frac{Z_s Z}{Z+Z_s}\right]\exp\left[-i2\pi\frac{n}{T}\frac{Z_s}{Z+Z_s}x\right]\right]$$

in which the irrelevant constant factors have been neglected. The first exponential term in the series is the wavefront curvature introduced by the lenslet 44. The first exponential term after the summation sign represents the phase shifts incurred by the various diffraction orders. Again, what is desired is for all of the phase shifts for values of n which do not result in integers, when divided by three, be equal to ⅓ wave. For this to be the case, Z must be given by the expression:

$$Z = \frac{2T^2 Z_s}{3\lambda Z_s - 2T^2}$$

Hence, in a manner similar to the case without lenslets, the value of Z should be chosen such that:

$$\frac{2T^2 Z_s}{3\lambda_{long} Z_s - 2T^2} < Z < \frac{2T^2 Z_s}{3\lambda_{short} Z_s - 2T^2}$$

wherein T is the periodicity of said multilevel optical phase element, $Z_s$ is equal to the distance between said multilevel optical phase element and said lenslets minus the focal length of said lenslets, $\lambda_{long}$ is the longest wavelength of interest and $\lambda_{short}$ is the shortest wavelength of interest.

Comparing this relationship with the relationship previously shown for $Z_{1/3}$ (the optimum distance for the plane wave illumination case):

$$\frac{Z_{1/3}}{Z} = 1 - \frac{2T^2}{3\lambda Z_s}$$

As $Z_s$ approaches infinity, the distance, Z, approaches $Z_{1/3}$, as is expected. For finite source distance $Z_s$, the optimum Z distance is greater than the plane wave distance $Z_{1/3}$.

The last exponential term indicates that the period of the light distribution at the optimum Z distance is no longer equal to the period of the original phase grating. In effect, free-space propagation from a source 10' located a finite distance from the grating 11 results in a magnification. This magnification, M, is given by the equation:

$$M = 1 = \frac{Z}{Z_s}$$

Note that for a finite source distance, $Z_s$, the magnification factor is greater than one.

The angular source size of the extended source 10 as seen at the grating 11, $S_m/Z_s$. This angular source size results in a new blur dimension, $b_n$, given by the expression:

$$b_n = \frac{S_m}{Z_s}Z = \frac{2T^2}{3\lambda Z_s - 2T^2}S_m$$

Because of the magnification described above, the new period of the image pattern is, $T_n$:

$$T_n = MT = \frac{3\lambda Z_s T}{3\lambda Z_s - 2T^2}$$

The resulting fractional blur of the image pattern can now be described by the relationships:

$$\frac{b_n}{T_n} = \frac{2T}{3\lambda Z_s}S_m = \frac{2T}{3\lambda Z_s}\frac{F_m}{F_c}S_c$$

The fractional blur, with the lenslet array 40 in position, can be directly related to the fractional blur, b/T, without the lenslet array 40, according to the expression:

$$\frac{b_n}{T_n} = \frac{b}{T}\frac{F_m}{Z_s}$$

This relationship clearly shows that the blurring can be dramatically reduced by the proper introduction of the lenslet array 40. The reduction factor of the blurring is the ratio $F_m/Z_s$.

So far, consideration has only been given to the one lenslet 43 centered on the optical axis (OA) of the condensing lens 30. Additional lenslets placed adjacent to the original lenslet 43 behave in a manner identical to that described above for the original lenslet 43. However, because of a coherent interaction between the light traversing different lenslets, an additional constraint is placed on the allowable center-to-center spacings of the lenslets. The minimum center-to-center spacing distance of the lenslets, L, is given by the expression:

$$L = pT\left(\frac{Z+Z_s}{Z}\right)$$

where p is a positive integer.

Figure 9:
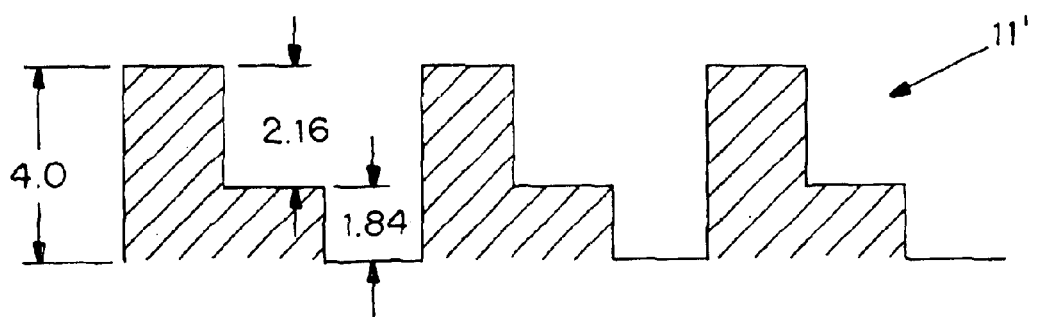
FIGS. 9 and 9A are block diagrams of a multilevel phase element and its complex conjugate, respectively.

In another embodiment, the multilevel phase element 11' shown in FIG. 9, and discussed above with respect to FIG. 3, includes a double step having an aggregate height of 4.0 μm. The first step is 1.84 μm measured from the base of the phase element and the second step is 2.16 μm measured from the top of the first step to the top of the phase element. A phase element constructed with these dimensions will function as described above.

Figure 9A:
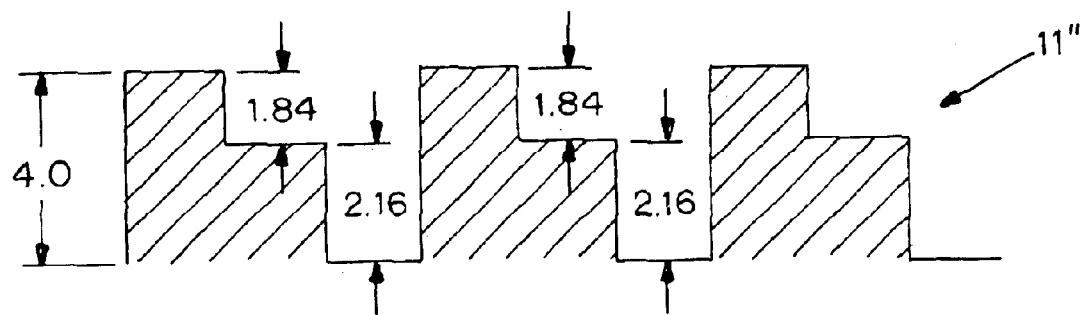

If instead of the phase element 11' shown, a complex conjugate phase element 11" as shown in FIG. 9A is constructed, the complex conjugate phase element 11" will perform equivalently to the phase element 11'. The reason for referring to phase element 11" as a complex conjugate phase element will become readily apparent if the complex conjugate phase element 11" is placed adjacent the phase element 11' such that the steps are aligned. Light passing through both phase elements will be unaffected, and thus, just as the integration of a wavefunction by its complex conjugate equals one, phase element 11" acts as the complex conjugate to phase element 11, thereby permitting the incident light to pass both elements through unaffected.

Unlike the phase element 11', the complex conjugate phase element 11" $Z_{1/3}$ is defined by:

$$Z_{1/3} = \frac{T^2}{3\lambda}$$

wherein λ is the central wavelength of the spectral distribution.

To achieve acceptable performance over the whole visible spectrum may be achieved by choosing the $Z_{1/3}$ distance to correspond to the wavelength at the center of the spectrum.

$$\frac{T^2}{3\lambda_{long}} < Z_{1/3} < \frac{T^2}{3\lambda_{short}}$$

where $\lambda_{long}$ is the longest wavelength of interest and $\lambda_{short}$ is the shortest wavelength of interest. Similarly, when lenslets are employed in conjunction with the complex conjugate phase element 11", Z must be chosen such that:

$$\frac{T^2 Z_s}{3\lambda_{long}Z_s - T^2} < Z < \frac{T^2 Z_s}{3\lambda_{short}Z_s - T^2}$$

wherein T is the periodicity of said multilevel optical phase element, $Z_s$ is equal to the distance between said multilevel optical phase element and said lenslets minus the focal length of said lenslets, $\lambda_{long}$ is the longest wavelength of interest and $\lambda_{short}$ is the shortest wavelength of interest. Thus, using a complex conjugate phase element permits a closer spacing than is permitted by the non-complex conjugate phase element.

Having shown the preferred embodiment, those skilled in the art will realize many variations are possible which will still be within the scope and spirit of the claimed invention. Therefore, it is the intention to limit the invention only as indicated by the scope of the following claims.

What is claimed is:

1. A method for displaying a color image comprising the steps of:

illuminating a multilevel optical phase element with a light source having a plurality of wavelengths of interest, said multilevel phase element dispersing each wavelength of interest from said light source by diffraction into a plurality of diffraction orders and projecting the dispersed light onto an imaging plane; and actuating a light modulating display in the imaging plane having a plurality of pixel elements, each said pixel element assigned to transmit a predetermined spectral region, positioned within the near field region of said multilevel optical phase element so as to receive said dispersed and projected light from said multilevel phase element.

2. The method of claim 1 wherein said display is positioned at a distance Z from said multilevel optical phase element, wherein Z is determined by the relationship:

$$\frac{2T^2}{3\lambda_{Long}} < Z < \frac{2T^2}{3\lambda_{Short}}$$

wherein T is the periodicity of said multilevel optical phase element, $\lambda_{long}$ is the largest wavelength of said plurality of wavelengths of interest and $\lambda_{short}$ is the shortest wavelength of said plurality of wavelengths of interest.

3. The method of claim 1 further comprising providing a light source having a polychromatic spectrum.

4. The method of claim 1 further comprising providing a plurality of subsources each subsource having a different spectral distribution.

5. The method of claim 4 further comprising emitting light from each said subsource with a light emitting diode.

6. The method of claim 4 further comprising providing a laser as each said subsource.

7. The method of claim 1 further comprising providing a multilevel optical phase element that is multilevel in two orthogonal directions.

8. The method of claim 1 wherein said display is positioned at a distance Z from said multilevel optical phase element, wherein Z is determined by the relationship:

$$\frac{T^2}{3\lambda_{Long}} < Z < \frac{T^2}{3\lambda_{Short}}$$

wherein T is the periodicity of said multilevel optical phase element, $\lambda_{long}$ is the largest wavelength of said plurality of wavelengths of interest and $\lambda_{short}$ is the shortest wavelength of said plurality of wavelengths of interest.

9. A method for displaying a color image comprising the steps of:
focusing light, from a light source having a plurality of wavelengths of interest, using a plurality of focusing elements, said plurality of focusing elements including a plurality of lenslets;
illuminating a multilevel optical phase element with light focused by said plurality of focusing elements, said multilevel phase element dispersing each wavelength of interest from said plurality of focusing elements by diffraction into a plurality of diffraction orders and projecting the dispersed light onto an imaging plane; and
actuating a light modulating display in the imaging plane having a plurality of pixel elements, each said pixel element assigned to transmit a predetermined spectral region, so as to receive said dispersed light from said multilevel optical phase element,
wherein said display is positioned at a distance Z from said multilevel optical phase element, wherein Z is determined by the relationship:

$$\frac{2T^2 Z_s}{3\lambda_{long} Z_s - 2T^2} < Z < \frac{2T^2 Z_s}{3\lambda_{short} Z_s - 2T^2}$$

wherein T is the periodicity of said multilevel optical phase element, $Z_s$ is equal to the distance between said multilevel optical phase element and said lenslets minus the focal length of said lenslets, $\lambda_{long}$ is the largest wavelength of said plurality of wavelengths of interest and $\lambda_{short}$ is the shortest wavelength of said plurality of wavelengths of interest.

10. The method of claim 9 wherein said multilevel optical phase element is constructed such that a magnification produced by said plurality of lenslets produces a dispersion element substantially equal to the dimensions of each pixel element in said display.

11. The method of claim 10 wherein said magnification (M) is given by the equation:

$$M = 1 + \frac{Z}{Z_s}$$

wherein T is the periodicity of said multilevel optical phase element, and $Z_s$ is equal to the distance between said multilevel optical phase element and said lenslets minus the focal length of said lenslets and Z is the distance between said multilevel optical phase element and said display.

12. A method for displaying a color image comprising the steps of:
focusing light, from a light source having a plurality of wavelengths of interest, using a plurality of focusing elements, said plurality of focusing elements including a plurality of lenslets;
illuminating a multilevel optical phase element with light focused by said plurality of focusing elements, said multilevel phase element dispersing each wavelength of interest from said plurality of focusing elements by diffraction into a plurality of diffraction orders and projecting the dispersed light onto an imaging plane; and
actuating a light modulating display in the imaging plane having a plurality of pixel elements, each said pixel element assigned to transmit a predetermined spectral region, so as to receive said dispersed light from said multilevel optical phase element,
wherein said display is positioned at a distance Z from said multilevel optical phase element, wherein Z is determined by the relationship:

$$\frac{T^2 Z_s}{3\lambda_{long} Z_s - 2T^2} < Z < \frac{T^2 Z_s}{3\lambda_{short} Z_s - 2T^2}$$

wherein T is the periodicity of said multilevel optical phase element, $Z_s$ is equal to the distance between said multilevel optical phase element and said lenslets minus the focal length of said lenslets, $\lambda_{long}$ is the largest wavelength of said plurality of wavelengths of interest and $\lambda_{short}$ is the shortest wavelength of said plurality of wavelengths of interest.

13. A apparatus for displaying a color image comprising:
a light source emitting a plurality of wavelengths of interest;
a multilevel optical phase element positioned to receive light from said light source, said multilevel phase element dispersing each wavelength of interest from said light source by diffraction into a plurality of diffraction orders and projecting the dispersed light onto an imaging plane; and
a light modulating electronic display positioned in the imaging plane and having a plurality of pixel elements, each said pixel element assigned to transmit a predetermined spectral region, positioned within the near field region of said multilevel optical phase element so as to receive said dispersed light from said multilevel phase element.

14. The apparatus of claim 13 wherein said display is positioned at a distance Z from said multilevel optical phase element, wherein Z is determined by the relationship:

$$\frac{T^2}{3\lambda_{Long}} < Z < \frac{T^2}{3\lambda_{Short}}$$

wherein T is the periodicity of said multilevel optical phase element, $\lambda_{long}$ is the largest wavelength of said plurality of wavelengths of interest and $\lambda_{short}$ is the shortest wavelength of said plurality of wavelengths of interest.

15. The apparatus of claim 14 wherein said light source has a polychromatic spectrum.

16. The apparatus of claim 13 wherein said display is positioned at a distance Z from said multilevel optical phase element, wherein Z is determined by the relationship:

$$\frac{T^2}{3\lambda_{Long}} < Z < \frac{T^2}{3\lambda_{Short}}$$

wherein T is the periodicity of said multilevel optical phase element, $\lambda_{long}$ is the largest wavelength of said plurality of wavelengths of interest and $\lambda_{short}$ is the shortest wavelength of said plurality of wavelengths of interest.

17. The apparatus of claim 13 wherein said light source comprises a plurality of subsources each subsource having a different spectral distribution.

18. The apparatus of claim 17 wherein each said subsource is a light emitting diode.

19. The apparatus of claim 17 wherein each said subsource is a laser.

20. The apparatus of claim 13 wherein said multilevel optical phase element is multilevel in two orthogonal directions.

21. An apparatus for displaying a color image comprising:
a light source having a plurality of wavelengths of interest;
a plurality of focusing elements positioned to focus light from said light source, said plurality of focusing elements including a plurality of lenslets;
a multilevel optical phase element positioned to receive light focused by said plurality of focusing elements, said multilevel phase element dispersing each wavelength of interest from said plurality of focusing elements by diffraction into a plurality of diffraction orders and projecting the dispersed light onto an imaging plane; and
a light modulating electronic display positioned in the imaging plane and having a plurality of pixel elements, each said pixel element assigned to transmit a predetermined spectral region, positioned so as to receive said dispersed light from said multilevel optical phase element,
wherein said display is positioned at a distance Z from said multilevel optical phase element, wherein Z is determined by the relationship:

$$\frac{2T^2 Z_s}{3\lambda_{long} Z_s - 2T_s} < Z < \frac{2T^2 Z_s}{3\lambda_{short} Z_s - 2T_s}$$

wherein T is the periodicity of said multilevel optical phase element, $Z_s$ is equal to the distance between said multilevel optical phase element and said lenslets minus the focal length of said lenslets, $\lambda_{long}$ is the largest wavelength of said plurality of wavelengths of interest and $\lambda_{short}$ is the shortest wavelength of said plurality of wavelengths of interest.

22. The apparatus of claim 21 wherein said multilevel optical phase element is constructed such that a magnification produced by said plurality of lenslets produces a dispersion element substantially equal to the dimensions of each pixel element in said display.

23. The apparatus of claim 21 wherein said magnification (M) is given by the equation:

$$M = 1 + \frac{Z}{Z_s}$$

wherein T is the periodicity of said multilevel optical phase element, Z is the distance between said multilevel optical phase element and said display and $Z_s$ is equal to the distance between said multilevel optical phase element and said lenslets minus the focal length of said lenslets.

24. The apparatus of claim 21 wherein said multilevel optical phase element is multilevel in two orthogonal directions.

25. The apparatus of claim 21 wherein said light source comprises a plurality of subsources each subsource having a different spectral distribution.

26. The apparatus of claim 25 wherein each said subsource is a light emitting diode.

27. The apparatus of claim 25 wherein each said subsource is a laser.

28. An apparatus for displaying a color image comprising:
a light source having a plurality of wavelengths of interest;
a plurality of focusing elements positioned to focus light from said light source, said plurality of focusing elements including a plurality of lenslets;
a multilevel optical phase element positioned to receive light focused by said plurality of focusing elements, said multilevel phase element dispersing each wavelength of interest from said plurality of focusing elements by diffraction into a plurality of diffraction orders and projecting the dispersed light onto an imaging plane; and
a light modulating electronic display positioned in the imaging plane and having a plurality of pixel elements, each said pixel element assigned to transmit a predetermined spectral region, positioned so as to receive said dispersed light from said multilevel optical phase element,
wherein said display is positioned at a distance Z from said multilevel optical phase element, wherein Z is determined by the relationship:

$$\frac{T^2 Z_s}{3\lambda_{long} Z_s - 2T^2} < Z < \frac{T^2 Z_s}{3\lambda_{short} Z_s - 2T^2}$$

wherein T is the periodicity of said multilevel optical phase element, $Z_s$ is equal to the distance between said multilevel optical phase element and said lenslets minus the focal length of said lenslets, $\lambda_{long}$ is the largest wavelength of said plurality of wavelengths of interest and $\lambda_{short}$ is the shortest wavelength of said plurality of wavelengths of interest.

29. The apparatus of claim 28 wherein said multilevel optical phase element is constructed such that a magnification produced by said plurality of lenslets produces a dispersion element substantially equal to the dimensions of each pixel element in said display.

30. The apparatus of claim 29 wherein said magnification (M) is given by the equation:

$$M = 1 + \frac{Z}{Z_s}$$

wherein T is the periodicity of said multilevel optical phase element, Z is the distance between said multilevel optical phase element and said display and $Z_s$ is equal to the distance between said multilevel optical phase element and said lenslets minus the focal length of said lenslets.

31. The apparatus of claim 28 wherein said multilevel optical phase element is multilevel in two orthogonal directions.

32. The apparatus of claim 21 wherein said light source comprises a plurality of subsources each subsource having a different spectral distribution.

33. The apparatus of claim 25 wherein each said subsource is a light emitting diode.

34. The apparatus of claim 25 wherein each said subsource is a laser.

* * * * *

UNITED STATES PATENT AND TRADEMARK OFFICE
CERTIFICATE OF CORRECTION

PATENT NO. : 6,791,756 B2  Page 1 of 1
APPLICATION NO. : 09/895865
DATED : September 14, 2004
INVENTOR(S) : Gary J. Swanson It is certified that error appears in the above-identified patent and that said Letters Patent is hereby corrected as shown below:

Column 18, Claim 32, delete "of claim 21" and insert --of claim 28--

Column 18, Claim 33, delete "of claim 25" and insert --of claim 32--

Column 18, Claim 34, delete "of claim 25" and insert --of claim 32--

Signed and Sealed this

Second Day of October, 2007

JON W. DUDAS
*Director of the United States Patent and Trademark Office*